US006828210B2

United States Patent
Kim et al.

(10) Patent No.: US 6,828,210 B2
(45) Date of Patent: Dec. 7, 2004

(54) METHOD OF FORMING A DEVICE ISOLATION TRENCH IN AN INTEGRATED CIRCUIT DEVICE

(75) Inventors: Do-Hyung Kim, Seoul (KR); Sung-Bong Kim, Kyunggi-do (KR); Jung-In Hong, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 194 days.

(21) Appl. No.: 10/080,884

(22) Filed: Feb. 22, 2002

(65) Prior Publication Data

US 2002/0119666 A1 Aug. 29, 2002

(30) Foreign Application Priority Data

Feb. 23, 2001 (KR) ..................................... 2001-0009381

(51) Int. Cl.[7] .............................................. H01L 21/76
(52) U.S. Cl. ...................... 438/424; 438/425; 438/435; 438/436; 438/691; 438/692
(58) Field of Search ................. 438/424–427, 438/434–437, 690–693

(56) References Cited

U.S. PATENT DOCUMENTS

| 5,190,889 | A | * | 3/1993 | Poon et al. .................. 438/437 |
| 6,037,018 | A | * | 3/2000 | Jang et al. ................... 427/579 |
| 6,046,487 | A | * | 4/2000 | Benedict et al. ............. 257/510 |
| 6,140,208 | A | * | 10/2000 | Agahi et al. ................. 438/437 |
| 6,180,493 | B1 | * | 1/2001 | Chu ........................... 438/437 |
| 6,251,735 | B1 | * | 6/2001 | Lou ........................... 438/296 |
| 6,461,937 | B1 | * | 10/2002 | Kim et al. ................... 438/431 |
| 2002/0117731 | A1 | * | 8/2002 | Kim et al. ................... 257/510 |

* cited by examiner

*Primary Examiner*—Duy-Vu Deo
(74) *Attorney, Agent, or Firm*—Marger Johnson & McCollom, P.C.

(57) ABSTRACT

A method of forming a trench isolation in a semiconductor substrate is described, which comprises the steps of forming a trench on the substrate, forming a diffusion barrier insulating layer, forming a thermal oxide layer both sidewall and bottom of the trench contacted with the diffusion barrier insulating layer, forming a nitride liner, and forming trench isolation material to fill the trench. A multi-structure of the barrier layer and the thermal oxide layer is provided between the nitride liner and the trench, resulting in minimization of transistor characteristic deterioration. A thin thermal oxide layer is formed to achieve improved trench etching profile.

9 Claims, 6 Drawing Sheets

METHOD OF FORMING A DEVICE ISOLATION TRENCH IN AN INTEGRATED CIRCUIT DEVICE

This application relies for priority upon Korean Patent Application No. 2001-09381, filed on Feb. 23, 2001, the contents of which are herein incorporated by reference in their entirety.

1. Field of the Invention

The present invention relates to a method of forming a semiconductor device and, more particularly, to a method of forming an isolation trench in an integrated circuit device.

2. Background of the Invention

Technology for forming device isolation trenches on a semiconductor substrate directly affects transistor characteristics and semiconductor device reliability. Poor device isolation causes leakage current, which wastes power supplied to semiconductor chips. Also, the possibility of undesirable device latch-up is heightened. Finally, poor device isolation causes problems of low noise margin, voltage shift, and crosstalk.

Local oxidation of silicon (LOCOS) has conventionally been used for device isolation. Patterned silicon nitride layer and pad oxide layer (for alleviating stress caused by the silicon nitride layer) are used to implant ions into an isolation region while masking an active region. Next, a thick field oxide layer is deposited to form a typical LOCOS structure. Unfortunately, LOCOS has several problems, e.g. bird's beak, which make it hard to fabricate a very large scale integrated circuit (VLSI). Threshold voltage increases and current driving capacity decreases.

In this regard, shallow trench isolation (STI) technique wherein a trench is formed by etching a semiconductor substrate and filling the trench with an insulating material to complete device isolation, has been used instead of LOCOS. Unfortunately, STI has some drawbacks as follows. The semiconductor substrate suffers from etching damage during etching the substrate to form the trench and oxidation of trench sidewall caused by subsequent oxidation processes, causing a physical and thermal stress. In this regard, recently, a thermal oxide layer is formed in the trench to cure etching damage and a nitride liner is formed on the thermal oxide layer as a buffer layer for stress.

The amount of wasted silicon is dependent upon the thickness of the thermal oxide layer. This produces a change in the trench upper edge profile that is capable of making the device malfunction. Thus the, defect rate is proportional to the thickness of the thermal oxide layer.

According to the foregoing conventional method, the trench is formed, and then a thick thermal oxide layer is formed to a thickness of, for example, 200 Å. Examination of the upper edge profile of a conventionally formed trench as shown in FIG. 8. It may be seen that the profile of the trench's upper edge becomes sharp, and a gate oxide layer formed on the trench's upper edge is substantially thinner than in other areas. This makes it hard to form a gate oxide layer of constant thickness. As a result, reliability of the gate oxide layer cannot be ensured. Further, if a strong electric field is applied, the thin gate oxide layer can break down.

On the other hand, if a thin thermal oxide layer, for example, 100 Å, is formed in the trench, the semiconductor substrate profile of the trench's upper edge is rounded and thus improved. Also, it is possible to prevent formation of a thin gate oxide layer at the trench's upper edge. However, charged particles, i.e., negative or positive particles (impurity materials) which are caused by defects at the interface between the nitride liner and the thermal oxide layer or defects of the layers during transistor operation by applying electric field, are not discharged to outside due to the nitride liner, but are diffused instead into the semiconductor substrate (active the region) through the thin thermal oxide layer. This is because the thermal oxide layer is too thin to trap the impurity materials sufficiently. When the positive ions reach the substrate at the trench sidewall, a transistor's electrical characteristics deteriorate. Thus, stand-by current becomes defective because the positive ions penetrate the substrate at the trench sidewall through the thin thermal oxide layer due to a tunneling phenomenon.

In a trench structure employing a conventional thermal oxide layer and nitride liner, device operation characteristics are largely dependent upon the thickness of the thermal oxide layer. Thus, it is very hard to achieve both good stress characteristic and good trench profile.

Therefore, an object of the present invention is to provide a method of forming an isolation trench, in which device characteristics are scarcely dependent upon the thickness of the thermal oxide layer. In other words, the object is to provide a method of forming a trench which can prevent deterioration of transistor characteristics.

SUMMARY OF THE INVENTION

According to one aspect of the present invention, there is provided a method of forming a trench isolation including a nitride liner in a semiconductor substrate. The substrate is etched to a predetermined depth to form a trench. A conformal material layer is formed on both the sidewall and the bottom of the trench. A thin thermal oxide layer is grown between the conformal material layer and the substrate through a thermal oxide process for preventing etch damage during etching. The nitride liner is formed on the material layer. Trench isolation material is used to fill the trench.

Overall thickness of the conformal material layer and the thermal oxide layer is enough to prevent penetration of impurity material. The conformal material layer is formed to a thickness of 50Å–400 Å, and the thermal oxide layer is formed to a thickness of 20Å–150 Å. The conformal material is selected from a group consisting of high temperature oxide (HTO), middle temperature oxide (MTO), aluminum trioxide ($Al_2O_3$), and tantalum pentaoxide ($Ta_2O_5$).

More specifically, the HTO layer is formed at a temperature of 800° C. using $SiH_4$, $O_2$, and $N_2$ as a source gas via a chemical vapor deposition (CVD) technique. The MTO layer is formed at a temperature of 730° C. using $SiH_4$, $O_2$, and $N_2$ as a source gas via the CVD technique. The aluminum trioxide layer is formed at a temperature of 350° C. under a pressure of 0.5 Torr using Al $(CH_3)_3$ of 150 sccm as a source gas and $H_2O$ of 150 sccm through the CVD technique. The tantalum pentaoxide layer is formed using $Ta(OC_2H_5)_5$ as a source gas and $O_2$ through the CVD technique.

An insulation layer for filling the trench is made of high-density plasma (HDP) oxide or borophosphosilicate glass (BPSG). If the trench is filled with HDP oxide, a middle temperature oxide (MTO) layer is preferably further formed so as to protect the nitride liner.

Preferably, the trench is formed by the steps of forming a pad oxide layer and a mask nitride layer on the substrate, patterning the mask nitride layer and pad oxide layer using a predetermined photoresist pattern in which a device isolation area is defined, and etching the substrate to a predetermined depth using the patterned mask nitride and pad oxide layers.

DESCRIPTION OF THE PREFERRED EMBODIMENT

Figure 1:
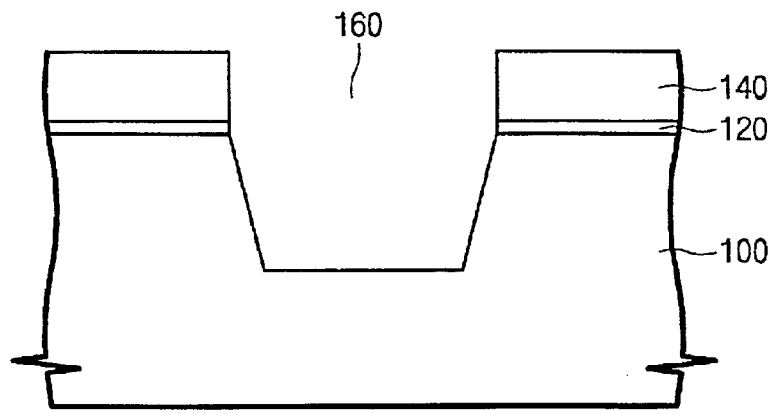
FIG. 1 through FIG. 7 are cross-sectional views showing the steps of forming trench isolation according to the present invention.

As flow diagrams, FIG. 1 through FIG. 7 illustrate the steps of forming a semiconductor device isolation trench in accordance with the present invention. FIG. 1 shows a semiconductor substrate 100 in which a trench 160 is formed. A pad oxide layer 120 and a mask nitride layer 140 are sequentially formed on the substrate 100. The mask nitride layer 140 is used as a mask pattern during etching to define a device isolation area. Although not shown in the drawing, an anti-reflection coating (ARC) layer, which is made of high temperature oxide (HTO) or silicon oxynitride layer (SiON) or a combination thereof, may be further formed on the mask nitride layer 140. The pad oxide layer 120 is formed to a thickness of 100Å–500 Å through thermal oxidation. The mask nitride layer 140 is formed to a thickness of 500Å–3000 Å through low pressure chemical vapor deposition (LPCVD). The mask nitride layer 140 and the pad oxide layer 120 are etched through the well-known photolithography and etching process to define a device isolation area. Using the mask nitride layer as an etching mask, the substrate 100 is etched to a predetermined depth to form the trench 160.

In the conventional thermal oxidation process, a trench is formed, and then a thermal oxide layer is formed on a trench inner wall (i.e., the bottom and both sidewalls). The formed oxide layer must be thin so as to form a rounded upper edge. However, if the thermal oxide layer is too thin, impurity materials penetrate the semiconductor substrate 100 especially through the trench upper edge.

Figure 10:
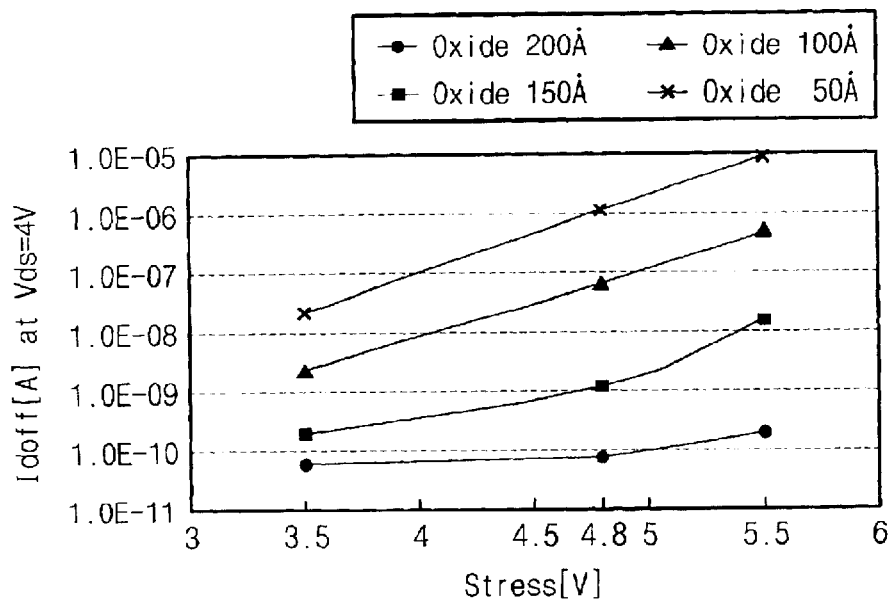
FIG. 10 is a graph illustrating the stress-drain current relationship when a voltage of 4V is applied to a stressed drain so as to check transistor characteristics based upon a thickness of a thermal oxide layer in accordance with a prior art.

FIG. 10 shows a drain current under variable stress (as in voltage) condition, i.e., 3.5V, 4.8V, 5.5V for 1810 seconds when a variable thickness of thermal oxides is formed right after trench formation. The drain current was measured when 0V was applied to a gate, a source and well (substrate) and 4V was applied to the drain immediately after applying the variable stress, respectively. A gate structure is used as the gate electrode, which is made by stacking polysilicon of 1000 Å and tungsten silicide of 1000 Å. The source/drain is formed by implanting arsenic (As) with an energy of 40 keV and a dose of $3.0 \times 10^{15}$ atoms/cm$^2$.

As shown in the graph of FIG. 10, the drain current from each stress is lowest in a thermal oxide layer of 200 Å, and is barely dependent on changes in stress voltage. The lower the thermal oxidation (i.e., the thinner the thermal oxide layer), the greater the drain current. Also, the greater the stress, the greater the drain current. Therefore, it is preferable that the thermal oxide layer has a measurable thickness.

In this regard, the thermal oxide layer must be thick (200 Å or more). However, a profile of the trench upper edge becomes sharp and the thickness of the gate oxide layer is relatively smaller at the trench upper edge than at others. Furthermore, electric fields are concentrated at the edge.

According to the present invention, an impurity material diffusion barrier layer including a thermal oxide layer is formed between a nitride layer and a trench inner wall so as to prevent impurity material penetration resulting from formation of a nitride liner. That is, a material layer for preventing the impurity material penetration is formed following formation of a trench and prior to formation of a thermal oxide layer. Afterwards, the thermal oxide layer is minimally formed through thermal oxidation.

Figure 2:
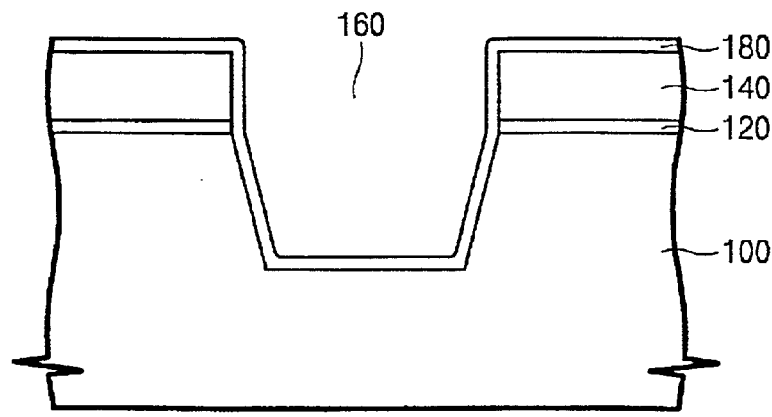
Figure 3:
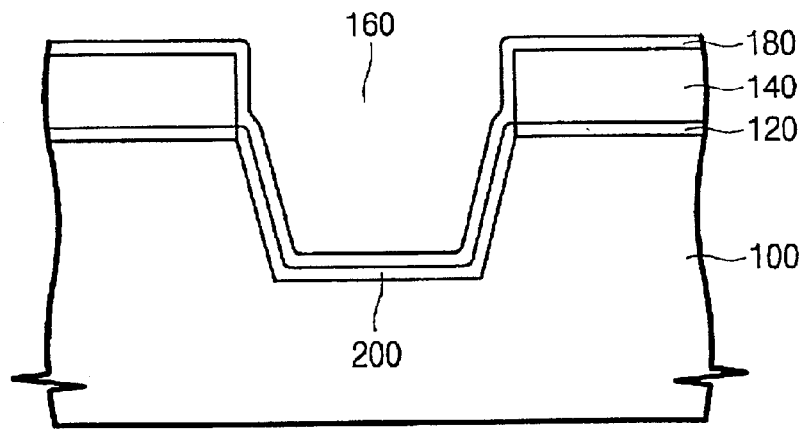

Referring to FIG. 2 and FIG. 3, it may be seen that thermal oxidation is not carried out directly after formation of a trench 160. Instead, thermal oxidation is carried out after a material layer 180 is conformally formed on a mask nitride layer including a trench inner wall by chemical vapor deposition (CVD) technique. A thermal oxide layer 200 is then formed on the trench inner wall under the material layer 180. The total thickness of the material layer 180 and the thermal oxide layer 200 must be sufficient to prevent impurity material penetration, for example, 200 Å and more. For example, the material layer 180 has a thickness of 50Å–400 Å, and the thermal oxide layer 200 has a thickness of 20Å–150 Å. Preferably, the thermal oxide layer 200 has a minimal thickness, e.g., 20Å–50 Å, in consideration of the stepped coating character of the trench isolation material. If the material layer 180 is formed to a thickness of 150 Å, the thermal oxide layer 200 will be formed to a thickness of 60 Å. Therefore, the total thickness will be 210 Å.

The material layer 180 is made of high temperature oxide (HTO), middle temperature oxide (MTO), aluminum trioxide, or tantalum pentaoxide, which are merely exemplary of dielectric materials that do not adversely effect a semiconductor substrate. The HTO layer is formed at a temperature of 800° C. using SiH$_4$, O$_2$, and N$_2$ as a source gas through chemical vapor deposition (CVD) technique. The MTO layer is formed at a temperature of 730° C. using SiH$_4$, O$_2$, and N$_2$ as a source gas through the CVD technique. The aluminum trioxide layer is formed at a temperature of 350° C. under a pressure of 0.5 Torr using Al(CH$_3$)$_3$ of 150 sccm as a source gas and H$_2$O of 150 sccm through the CVD technique. The tantalum pentaoxide layer is formed using Ta(OC$_2$H$_5$)$_5$ as a source gas and O$_2$ through the CVD technique.

After forming the material layer 180 on the trench inner wall, the thermal oxide layer 200 is formed through the thermal oxidation process. In this case, the thermal oxide layer 200 is formed on the inner wall (i.e., the bottom and the sidewalls) of the trench under the material layer 180. Since the material layer 180 serves to prevent oxygen diffusion in the thermal oxidation process, thermal oxide layer growth is reduced more than in the case where a thermal oxide layer is formed immediately after the trench is formed.

Figure 4:
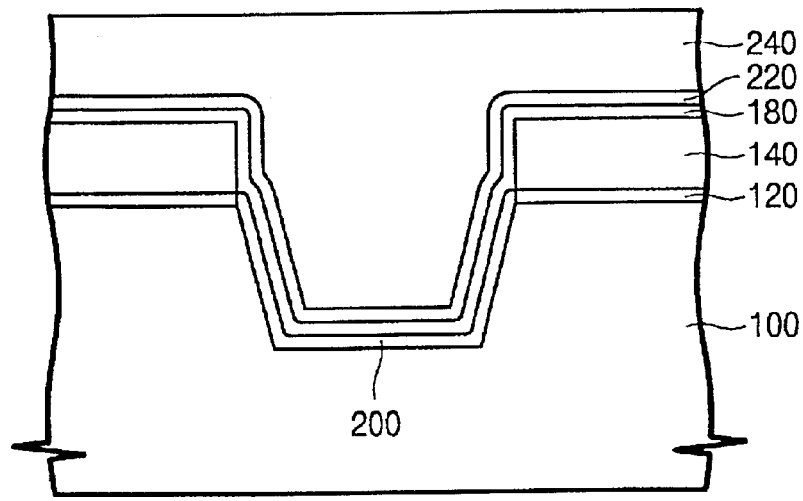

Referring to FIG. 4, a nitride liner 220 is formed to a thickness range of 30Å–100 Å on the structure that results from the material layer 180 and the thermal oxide layer 200 formation. The nitride liner 220 serves to prevent oxidation of the trench inner wall, and to alleviate the stress applied to the trench inner wall.

A trench isolation material 240 is deposited on the mask nitride layer 140 to a thickness of 3000Å–10000 Å, filling the trench. As the trench isolation material, high-density plasma (HDP) oxide or BPSG can be used. The isolation material layer 240 is densified through a high-temperature densification process. If the HDP oxide is used as the trench isolation material, a middle temperature oxide (MTO) layer is preferably used so as to protect an underlying nitride liner.

Figure 5:
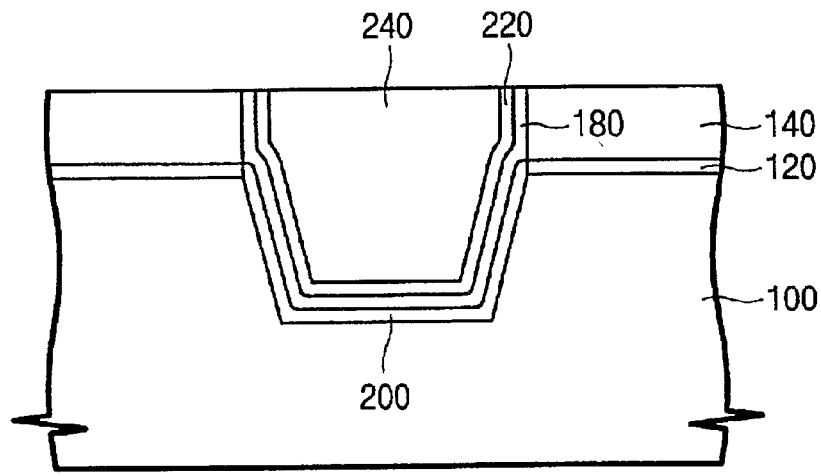

FIG. 5 shows use of the mask nitride layer 140 as an etch-stop layer, and planarization of the trench isolation material 240 by chemical mechanical polishing (CMP). The mask nitride layer 140 and the pad oxide layer 120 are removed to complete the isolation trench. Since the material layer 180 has been formed between the nitride liner 220 and the mask nitride layer 140 (i.e., the mask nitride layer 140 and the nitride liner 220 are not connected together at the trench upper edge), it is possible to minimize a so-called dent phenomenon whereby a nitride layer is partially etched at the time of removing a mask nitride layer.

Figure 6:
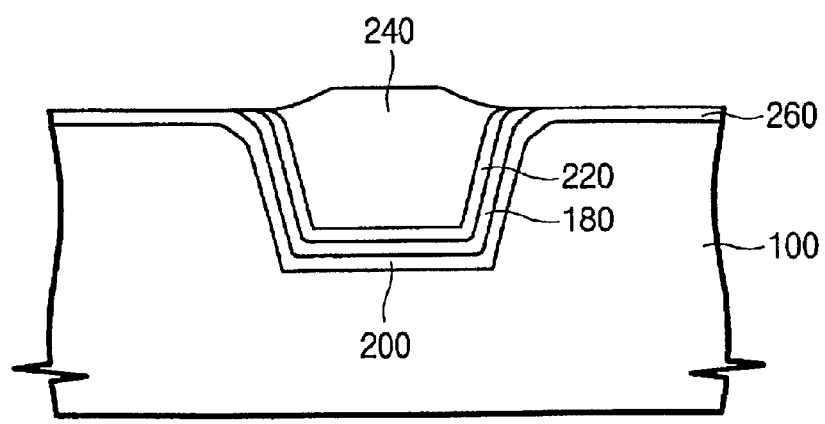

Various processes for fabricating a semiconductor are subsequent to formation of the isolation trench. Initially, a metal oxide silicon field effect transistor (MOSFET) process is carried out. Referring to FIG. 6, a gate oxide layer 260 is formed on a semiconductor substrate 100 following a sacrificial oxide layer forming process and a cleaning process. Since a thermal oxide layer can reach a minimal thickness according to the present invention, a trench upper edge is etched to be rounded. This makes is possible to prevent a thin formation of the gate oxide layer 260 at the trench upper edge.

Figure 7:
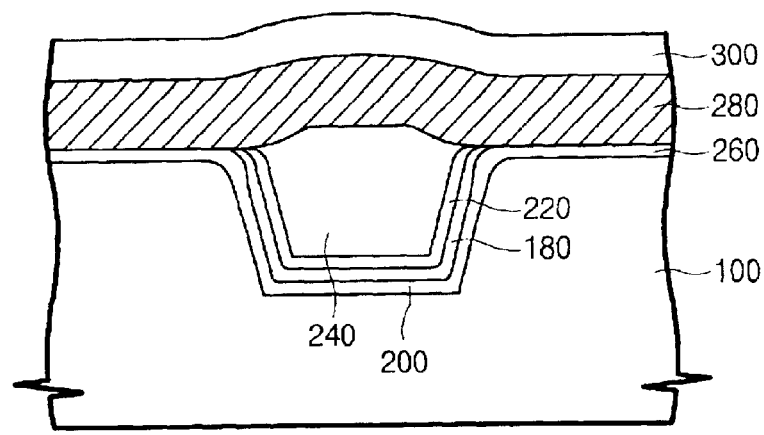
Figure 8:
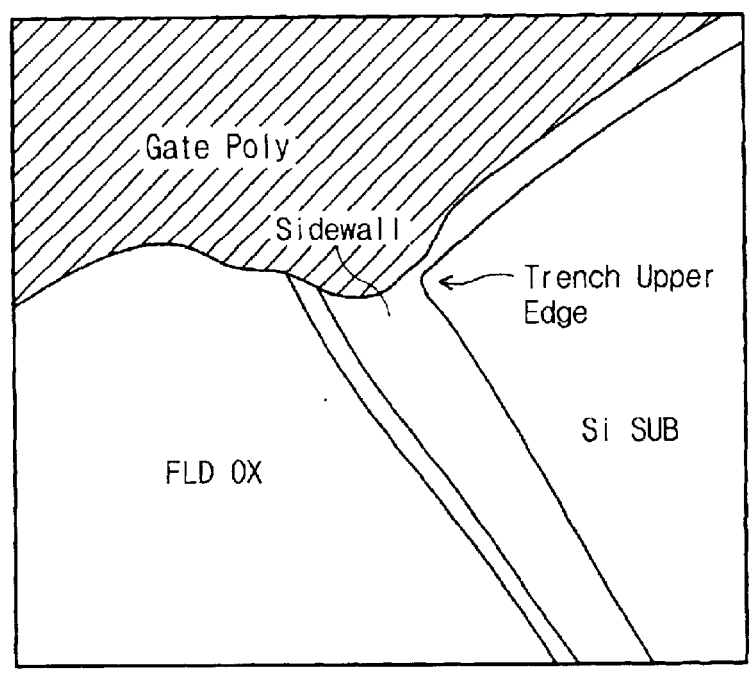
FIG. 8 is a cross-sectional view showing a semiconductor substrate after formation of a gate oxide layer, in a trench isolation structure formed to a thickness of 200 Å according to a prior art.
Figure 9:
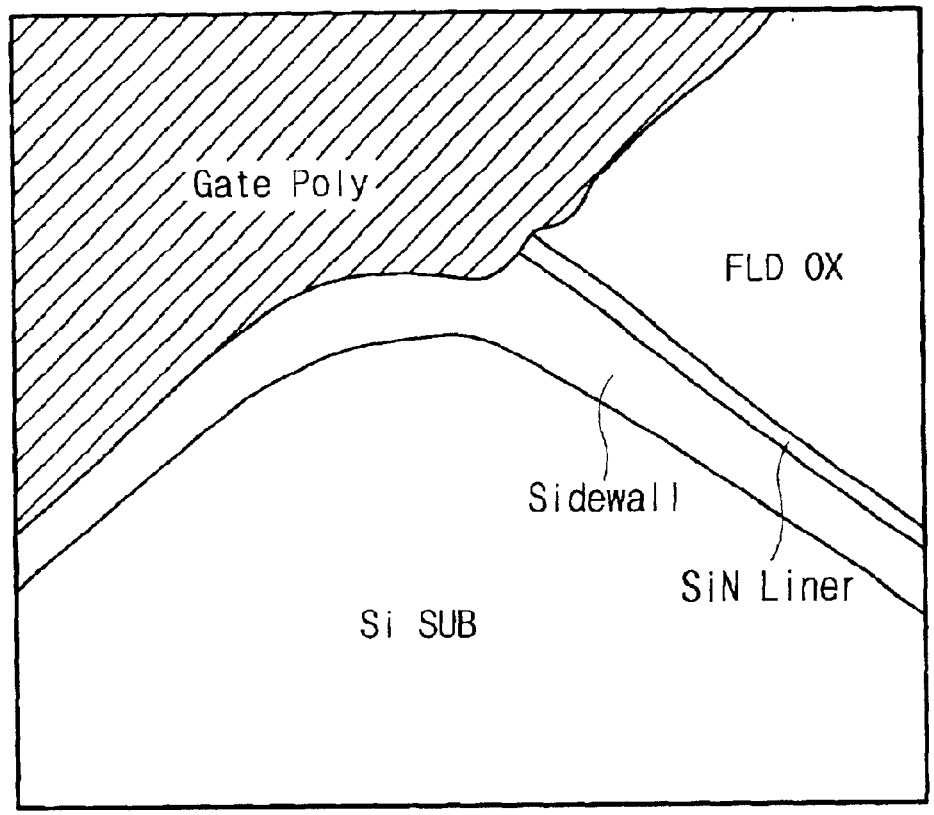
FIG. 9 is a cross-sectional view showing a semiconductor substrate after formation of a gate oxide layer, in a trench isolation structure formed to a thickness of 100 Å according to a prior art.

Referring to FIG. 7, after formation of gate oxide layer 260, a gate electrode 280 and a gate capping layer 300 are sequentially formed.

Next, impurity materials are implanted into a semiconductor substrate 100 to form a source/drain region (not shown). As is known, conductive types of the materials and the substrate 100 are different from each other.

Figure 11:
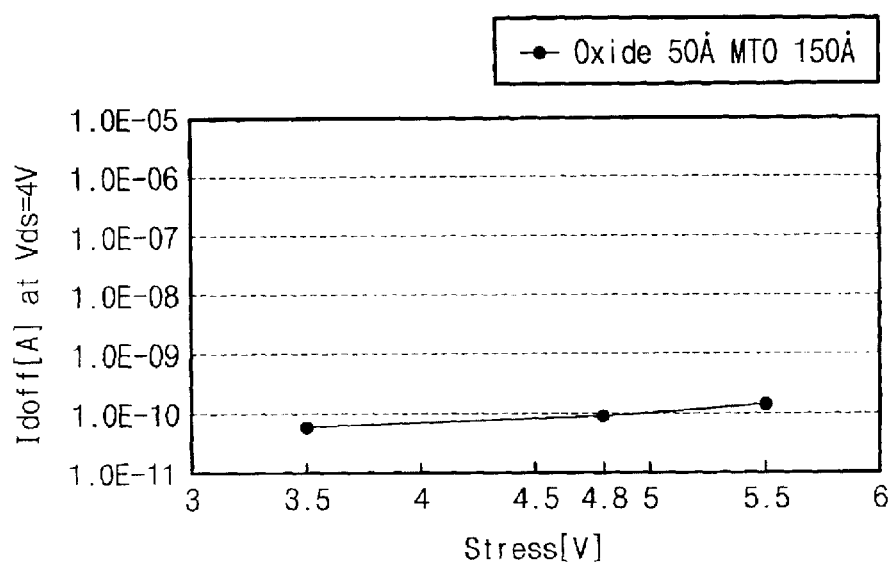
FIG. 11 is a graph illustrating the stress-drain current relationship when a thermal oxide layer is formed to a thickness of 50 Å after a middle temperature oxide (MTO) layer is formed to a thickness of 150 Å according to the present invention.

FIG. 11 shows a drain current under same stress (as in voltage) condition as illustrated in FIG. 10 i.e., 3.5V, 4.8V, 5.5V for 1810 seconds, when 150 Å thick MTO layer and 50 Å thick thermal oxide layer are formed after trench formation according to one embodiment of the present invention. The drain current was measured when 0V was applied to a gate, a source and well (substrate) and 4V was applied to the drain immediately after applying the variable stress, respectively. Comparing FIG. 10 and FIG. 11, the drain current characteristics of the present invention with double layer structure (200 Å) of MTO and thermal oxide layer exhibits substantially the same results as compared to the prior art of single thermal oxide layer of 200 Å. Accordingly, the present invention can form a thermal oxide layer as thin as possible for excellent profile at the trench upper edge as well as avoiding impurity materials penetration, obtaining excellent stress characteristics.

While an illustrative embodiment of the present invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

What is claimed is:

1. A method of forming an isolation trench including a nitride liner in a semiconductor substrate, comprising:

etching the substrate to form a trench therein;

forming a conformal material layer on sidewall and bottom of the trench, wherein the conformal material layer comprises a material selected from the group consisting of high temperature oxide (HTO), aluminum trioxide ($Al_2O_3$), and tantalum pentaoxide ($Ta_2O_5$);

growing a thermal oxide layer between the conformal material layer and the substrate;

forming the nitride liner on the material layer; and filling the trench with a trench isolation material.

2. The method as claimed in claim 1, wherein the conformal material layer is formed to a thickness of 50 Å–400 Å, and the thermal oxide layer is formed to a thickness of 20 Å–150 Å.

3. The method as claimed in claim 1, wherein the trench isolation material is made of high-density plasma (HDP) oxide or borophosphosilicate glass (BPSG) to a thickness of 3000 Å–10000 Å.

4. The method of claim 1, wherein the conformal material layer is formed before growing the thermal oxide layer.

5. The method of claim 1, wherein the HTO is formed at a temperature of 800° C.

6. A method of forming an isolation trench including a nitride liner in a semiconductor substrate, comprising:

etching the substrate to form a trench therein;

forming a thermal oxide layer on sidewalls and bottom of the trench;

forming a conformal material layer on the thermal oxide layer, wherein the material layer comprises a material selected from the group consisting of high temperature oxide (HTO), aluminum trioxide ($Al_2O_3$), and tantalum pentaoxide ($Ta_2O_5$);

forming the nitride liner on the conformal material layer; and forming a trench isolation material on the nitride liner to fill the trench.

7. The method as claimed in claim 6, wherein the conformal material layer is formed to a thickness of 50 Å–400 Å, and the thermal oxide layer is formed to a thickness of 20 Å–150 Å.

8. The method of claim 6, wherein the conformal material layer is formed after growing the thermal oxide layer.

9. The method of claim 6, wherein the HTO is formed at a temperature of 800° C.

* * * * *